(12) United States Patent
Li et al.

(10) Patent No.: US 10,580,804 B2
(45) Date of Patent: Mar. 3, 2020

(54) ARRAY SUBSTRATE, FABRICATING METHOD THEREFOR AND DISPLAY DEVICE

(71) Applicant: BOE TECHNOLOGY GROUP CO., LTD., Beijing (CN)

(72) Inventors: Haixu Li, Beijing (CN); Zhanfeng Cao, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/968,835

(22) Filed: May 2, 2018

(65) Prior Publication Data
US 2019/0027511 A1    Jan. 24, 2019

(30) Foreign Application Priority Data

Jul. 19, 2017    (CN) .......................... 2017 1 0591961

(51) Int. Cl.
*H01L 27/12* (2006.01)
*H01L 29/786* (2006.01)

(52) U.S. Cl.
CPC ........ *H01L 27/1251* (2013.01); *H01L 27/127* (2013.01); *H01L 27/1222* (2013.01); *H01L 27/1225* (2013.01); *H01L 27/1248* (2013.01); *H01L 27/1259* (2013.01); *H01L 29/78606* (2013.01)

(58) Field of Classification Search
CPC ............. H01L 27/1251; H01L 27/1222; H01L 27/1225; H01L 27/1248; H01L 27/1259
See application file for complete search history.

(56) References Cited

U.S. PATENT DOCUMENTS

2016/0163745 A1    6/2016    Choi et al.
2019/0103420 A1*   4/2019    Liu ..................... H01L 27/1259

FOREIGN PATENT DOCUMENTS

CN    103715196 A    4/2014
CN    106876412 A    6/2017

OTHER PUBLICATIONS

First Office Action for Chinese Patent Application No. 201710591961.8 dated Apr. 19, 2019.

* cited by examiner

*Primary Examiner* — Elias Ullah
(74) *Attorney, Agent, or Firm* — Calfee, Halter & Griswold LLP

(57) ABSTRACT

The present disclosure provides an array substrate, a fabricating method thereof, and a display device. The array substrate includes a base substrate which has a first region and a second region respectively provided with a first transistor and a second transistor. The first transistor has a first active layer of low-temperature polysilicon, and the second transistor has a second active layer of metal oxide semiconductor. The first active layer, an interlayer dielectric layer and the second active layer are sequentially disposed on the base substrate, and a barrier layer is disposed between the interlayer dielectric layer and the second active layer.

18 Claims, 5 Drawing Sheets

ARRAY SUBSTRATE, FABRICATING METHOD THEREFOR AND DISPLAY DEVICE

CROSS REFERENCE

This disclosure claims the priority of Chinese Patent Application No. 201710591961.8 filed on Jul. 19, 2017 and titled "ARRAY SUBSTRATE, FABRICATING METHOD THEREFOR AND DISPLAY DEVICE". The content of this application is incorporated in its entirety into this disclosure by reference.

TECHNICAL FIELD

The present disclosure relates to the field of display technology, and in particular, to an array substrate, a fabricating method therefor, and a display device.

BACKGROUND

At present, AMOLED (Active Matrix Organic Light Emitting Diode) technology represents a development trend of electronic products because of its wider viewing angle, higher refresh rate, and thinner size. It has been widely used in smart phones.

LTPO (Low Temperature Polycrystalline Oxide) technology combines advantages of both TFTs of LTPS-TFT (Low Temperature Poly-Silicon Thin Film Transistor) and Oxide-TFT (Oxide Thin Film Transistor), and having certain technical advantages in terms of high PPI (Pixels Per Inch), low power consumption, high image quality, etc. of AMOLED products. In addition, since Oxide-TFT has the advantage of lower leakage current, it also has certain advantages in sensor technology applications of LTPS+Oxide.

On this basis, the development of LTPO process has high value and significance. The technical solutions in the prior art still have room for improvement.

It should be noted that the information disclosed in the foregoing background section is only for enhancement of understanding of the background of the disclosure and therefore may include information that does not constitute prior art that is already known to those of ordinary skill in the art.

SUMMARY

Additional features and advantages of the disclosure will become apparent from the following detailed description, or may be learned in part by practice of the disclosure.

According to an aspect of the present disclosure, there is provided an array substrate including:
a base substrate;
wherein the base substrate has a first region and a second region provided with a first transistor and a second transistor, respectively, the first transistor having a first active layer of low-temperature polysilicon, and the second transistor having a second active layer of metal oxide semiconductor; and
wherein the first active layer, an interlayer dielectric layer and the second active layer are sequentially disposed on the base substrate, and a barrier layer is disposed between the interlayer dielectric layer and the second active layer.

In an exemplary embodiment of the present disclosure, the barrier layer is formed by oxidation treatment of remaining metal that is left after partially etching a source-drain metal layer.

In an exemplary embodiment of the present disclosure, the barrier layer has a thickness of about 100-300 Å.

In an exemplary embodiment of the present disclosure, a material for the remaining metal is titanium, and a material for the barrier layer is titanium oxide; or
a material for the remaining metal is aluminum, and a material for the barrier layer is aluminum oxide.

In an exemplary embodiment of the present disclosure, the first transistor is of a top-gate structure, and the second transistor is of a bottom-gate structure.

In an exemplary embodiment of the present disclosure, the first transistor includes the first active layer, a first insulating layer, a first gate and the interlayer dielectric layer formed on the base substrate in sequence, and a source and a drain of the first transistor are respectively electrically connected to two ends of the first active layer via two through holes; the second transistor includes a second gate, a second insulating layer, the second active layer and a protection layer formed on the barrier layer in sequence, and a source and a drain of the second transistor are respectively electrically connected to two ends of the second active layer via two through holes.

According to a second aspect of the present disclosure, there is provided a method for fabricating an array substrate, including:
forming a first transistor and a barrier layer on a first region of a base substrate by a plurality of patterning processes, the first transistor having a first active layer and an interlayer dielectric layer, and the first active layer being of low-temperature polysilicon;
forming a second transistor above the barrier layer in a second region by a plurality of patterning processes, the second transistor having a second active layer of metal oxide semiconductor;
wherein the barrier layer is formed between the interlayer dielectric layer and the second active layer, and the barrier layer extends to the second region of the base substrate.

In an exemplary embodiment of the present disclosure, forming the first transistor and the barrier layer includes:
forming a first insulating layer and the interlayer dielectric layer on the first region and the second region of the base substrate, and forming the first active layer and a first gate on the first region by a patterning process, wherein the interlayer dielectric layer covers the first gate and the first insulating layer;
forming a source-drain metal layer on the base substrate on which the interlayer dielectric layer is formed;
forming a source and a drain of the first transistor in the first region and forming a second gate in the second region by one patterning process, and partially etching the source-drain metal layer in regions other than the source and the drain of the first transistor and the second gate to obtain a remaining metal; and
oxidizing the remaining metal to obtain the barrier layer.

In an exemplary embodiment of the present disclosure, a material for the source-drain metal layer is a titanium-aluminum-titanium alloy, a material for the remaining metal is titanium, and a material for the barrier layer is titanium oxide; or
a material for the source-drain metal layer is an aluminum-titanium alloy, the remaining metal is aluminum, and a material for the barrier layer is aluminum oxide.

According to a third aspect of the present disclosure, there is provided a display device including the above-described array substrate.

In the array substrate of some embodiments of the present disclosure, the barrier layer is provided to play insulation and hydrogen-block role for the interlayer dielectric layer of the low-temperature polysilicon thin film transistor and the active layer of the oxide thin film transistor, to prevent the hydrogen permeation between the low-temperature polysilicon thin film transistor and the oxide thin film transistor in the subsequent heat treatment process, and to protect the transistor characteristics of the low-temperature polysilicon thin film transistor and the oxide thin film transistor from being adversely affected.

It is to be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate embodiments in compliance with the present disclosure and, together with the specification, serve to explain the principles of the present disclosure. Apparently, the accompanying drawings in the following description are merely some embodiments of the present disclosure, and those skilled in the art may further derive other drawings based on these accompanying drawings without creative labor.

DETAILED DESCRIPTION

Figure 1:
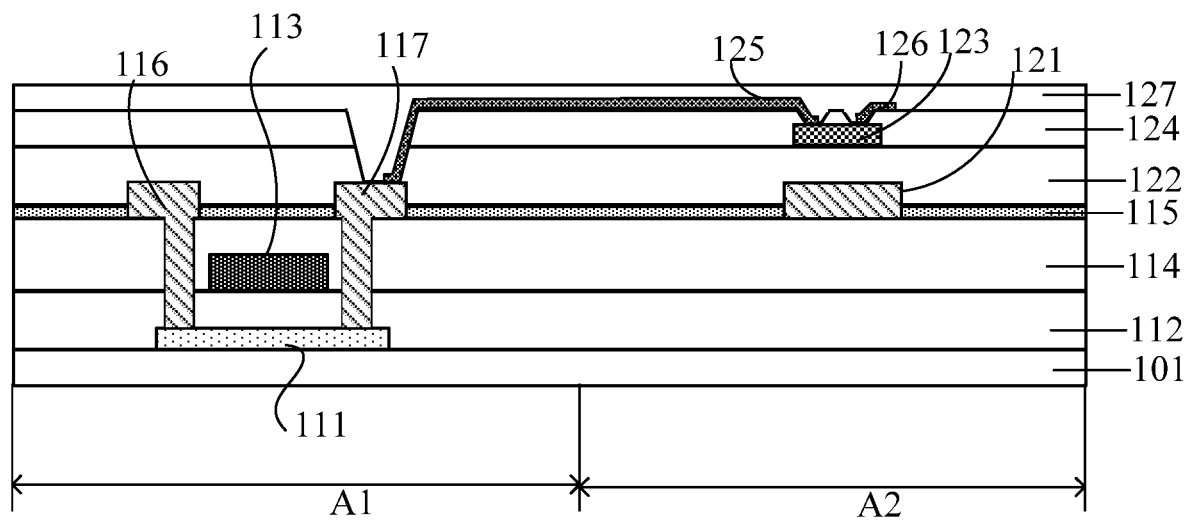
FIG. 1 illustrates a schematic view of an array substrate provided in an exemplary embodiment of the present disclosure.

Exemplary embodiments will now be described more fully with reference to the accompanying drawings. However, the exemplary embodiments may be embodied in many forms and should not be construed as limited to the examples set forth herein; rather, these embodiments are provided to make the present disclosure more full and complete, and to fully convey the concepts of the exemplary embodiments to those skilled in the art. The drawings are merely schematic illustrations of the present disclosure and are not necessarily drawn to scale. The same reference numerals in the drawings denote the same or similar parts, and repeated description thereof will be omitted.

Furthermore, the described features, structures, or characteristics may be combined in any suitable manner in one or more embodiments. In the following description, numerous specific details are provided to provide a full understanding of the embodiments of the present disclosure. However, those skilled in the art will recognize that the technical solutions of the present disclosure may be practiced while omitting one or more of the specific details, or that other methods, components, devices, steps, etc. may be employed. In other instances, well-known structures, methods, devices, implementations, materials, or operations are not shown or described in detail to avoid reversing the primary and the secondary and obscuring aspects of the present disclosure.

Some of the blocks shown in the figures are functional entities and do not necessarily correspond to physically or logically separate entities. These functional entities may be implemented in software, or implemented in one or more hardware modules or integrated circuits, or implemented in different networks and/or processor devices and/or microcontroller devices.

In the existing LTPO process, it is required to form an oxide layer on the LTPS layer. The oxide process involves multiple steps of processes such heat treatment and annealing, which results in that hydrogen in the ILD (Inter Layer Dielectric) layer of the LTPS-TFT will enter the oxide in the subsequent heat treatment, affecting the transistor characteristics of Oxide-TFT. Hydrogen and oxygen in the oxide layer may enter the LTPS in the subsequent heat treatment, affecting the transistor characteristics of the LTPS-TFT.

The array substrate, the fabricating method thereof, and the display device provided in the embodiments of the present disclosure can overcome one or more problems caused by limitations and disadvantages of the related art, at least to a certain extent.

FIG. 1 illustrates a schematic view of an array substrate provided in an exemplary embodiment of the present disclosure.

As shown in FIG. 1, the array substrate includes: a base substrate 101, a first transistor disposed in a first region A1 of the base substrate 101 and a second transistor disposed in a second region A2 of the base substrate 101, wherein the first transistor has a first active layer of low-temperature polysilicon, that is, the first transistor is a low-temperature polysilicon thin film transistor (hereinafter abbreviated as LTPS-TFT); and the second transistor has a second active layer of metal oxide semiconductor, that is, the second transistor is an oxide thin film transistor (hereinafter abbreviated as Oxide-TFT).

As shown in FIG. 1, the first transistor includes in its structure: a first active layer 111, a first insulating layer 112, a first gate 113, and an interlayer dielectric layer 114 formed on the base substrate 101 in sequence. The source 116 and the drain 117 of the first transistor are respectively electrically connected to two ends of the first active layer 111 via two through holes. The structure and fabricating process for the first transistor are the same as those of the existing LTPS-TFT, but in the present embodiment, a barrier 115 is additionally provided above the interlayer dielectric layer 114.

Here, the active layer 111 is of polysilicon (P—Si), and its formation process can use ELA (Excimer Laser Annealing) technology to apply a high-power laser beam to a surface of the to-be-crystallized amorphous silicon (a-Si) film. Due to the extremely strong UV absorption ability of silicon, the surface of the amorphous silicon film may be made to reach a high temperature above 1000° C. instantaneously in a very short time (50 ns to 150 ns) and turns into a molten state. After the laser pulse stops, the melted amorphous silicon cools and crystallizes into polysilicon. Here, the first insulating layer 112 is a gate insulating layer covering the first active layer 111, and may be a single-layered silicon oxide (SiOx) film or a double-layered film including silicon nitride (SiNx) and SiOx. A material for the interlayer dielectric layer 114 is SiNx/SiO$_2$, and after its film formation, it will be activated at 600° C. for 1 to 3 minutes and hydrogenated at 380 to 420° C. for 30 minutes to finally obtain an interlayer dielectric layer 114.

In this embodiment, the barrier layer 115 is formed by performing oxidation treatment on a remaining metal that is left after partially etching a source-drain metal layer. Usually, the source-drain metal is an alloy material such as titanium-aluminum-titanium alloy or aluminum-titanium alloy. As such, in the process of etching the source-drain metal to form the source 116 and the drain 117, the regions other than the source 116 and the drain 117 are partially etched to obtain the remaining metal (i.e., a first layer of metal) that is titanium or aluminum, which is further subjected to oxidative doping treatment, and the obtained titanium oxide or aluminum oxide is the barrier layer.

In this embodiment, a thickness of the barrier layer may be 100-300 Å. Take titanium oxide as an example, the titanium oxide of 100-300 Å has a property approximating to insulator, and can serve to block the hydrogen in the interlayer dielectric layer 115 from entering a second transistor during subsequent heat treatments.

It should be noted that, in other embodiments of the present disclosure, the barrier layer may also be other metal that can be converted into a non-conductive dielectric film after oxygen plasma oxidation treatment, so long as it may serve to block hydrogen in the interlayer dielectric layer from entering the second transistor. There is no specific limitation thereto.

As shown in FIG. 1, the gate of the second transistor, i.e., a second gate 121 formed on the barrier layer 115, may be formed by etching the source-drain metal in the second region A2. As such, the source 116 and the drain 117 of the first transistor and the second gate 121 of the second transistor are disposed in the same layer, and the barrier layer 115 is also disposed around the second gate 121. The second transistor further includes: a second insulating layer 122, a second active layer 123, a protection layer 124, and a source 125 and a drain 126 of the second transistor. The source 125 and the drain 126 of the second transistor are also electrically connected to two ends of the second active layer 123 via two through holes, respectively. Finally, a passivation layer 127 is further provided over the source 125 and the drain 126 of the second transistor.

Here, the second insulating layer 122 is a gate insulating layer covering the second gate 121, and has a material which may be a single-layered silicon oxide (SiOx) film or a double-layered film including silicon nitride (SiNx) and SiOx. The second active layer 123 is an oxide film, and is formed through a patterning process after film formation of an oxide semiconductor material. Here, the oxide semiconductor material is specifically an oxide semiconductor containing at least one of metals such as indium, gallium, and zinc.

It should also be noted that the division of the boundaries between the first region and the second region is not described in detail in this embodiment, and this is not the design focus of the present disclosure. The first region and the second region are marked only for illustrating that LTPS-TFT and Oxide-TFT are disposed in different regions. LTPS-TFTs are often used as switching transistors due to rapid switching. Oxide-TFTs are generally used as driving transistors due to semiconductor characteristics. Because of their different characteristics and functions, the two transistors need to be disposed in the corresponding regions, respectively, which can achieve a better effect than pure LTPS-TFT or pure Oxide-TFT. The LTPS's too high electron mobility causes huge power consumption. Combining the low power consumption of oxides with the LTPS's advantage will maximize the advantages of the two kinds of transistors.

In summary, in the array substrate provided by the present embodiment, a barrier layer is provided to play insulation and hydrogen-blocking role for the interlayer dielectric layer of the low-temperature polysilicon thin film transistor and the active layer of the oxide thin film transistor, to block the hydrogen permeation between the low-temperature polysilicon thin film transistor and the oxide thin film transistor in the subsequent heat treatment process, and to protect the transistor characteristics of the low-temperature polysilicon thin film transistor and the oxide thin film transistor from being adversely affected. In addition, the barrier layer may also block hydrogen and oxygen in the second active layer from affecting the transistor characteristics of the low-temperature polysilicon thin film transistor in the subsequent heat treatment.

Figure 2:
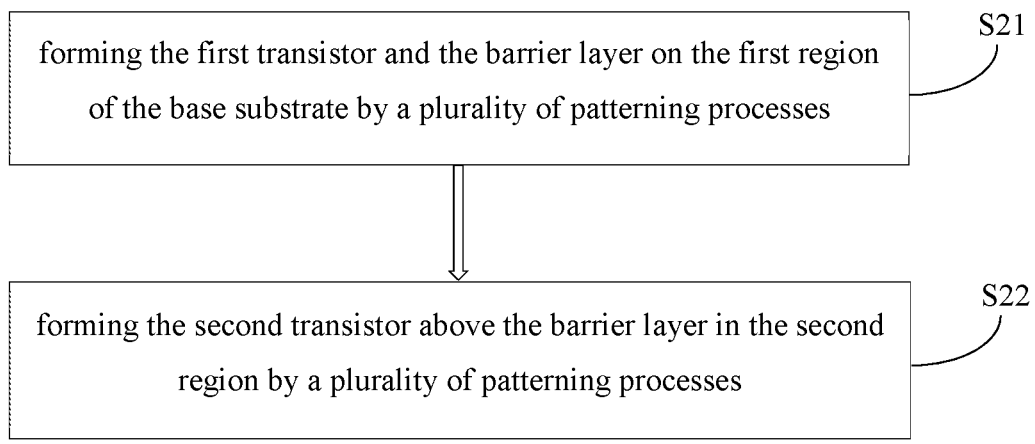
FIG. 2 illustrates a flowchart of a method for fabricating an array substrate provided in another exemplary embodiment of the present disclosure.

FIG. 2 illustrates a flowchart of a method for fabricating an array substrate provided in another embodiment of the present disclosure.

As shown in FIG. 2, in step S21, the first transistor and the barrier layer are formed on the first region of the base substrate by a plurality of patterning processes. It should be noted that, in this embodiment, the barrier layer is formed by further oxidation treatment in the process of forming the first transistor, and thus the barrier layer also extends to the second region of the base substrate.

Figure 3:
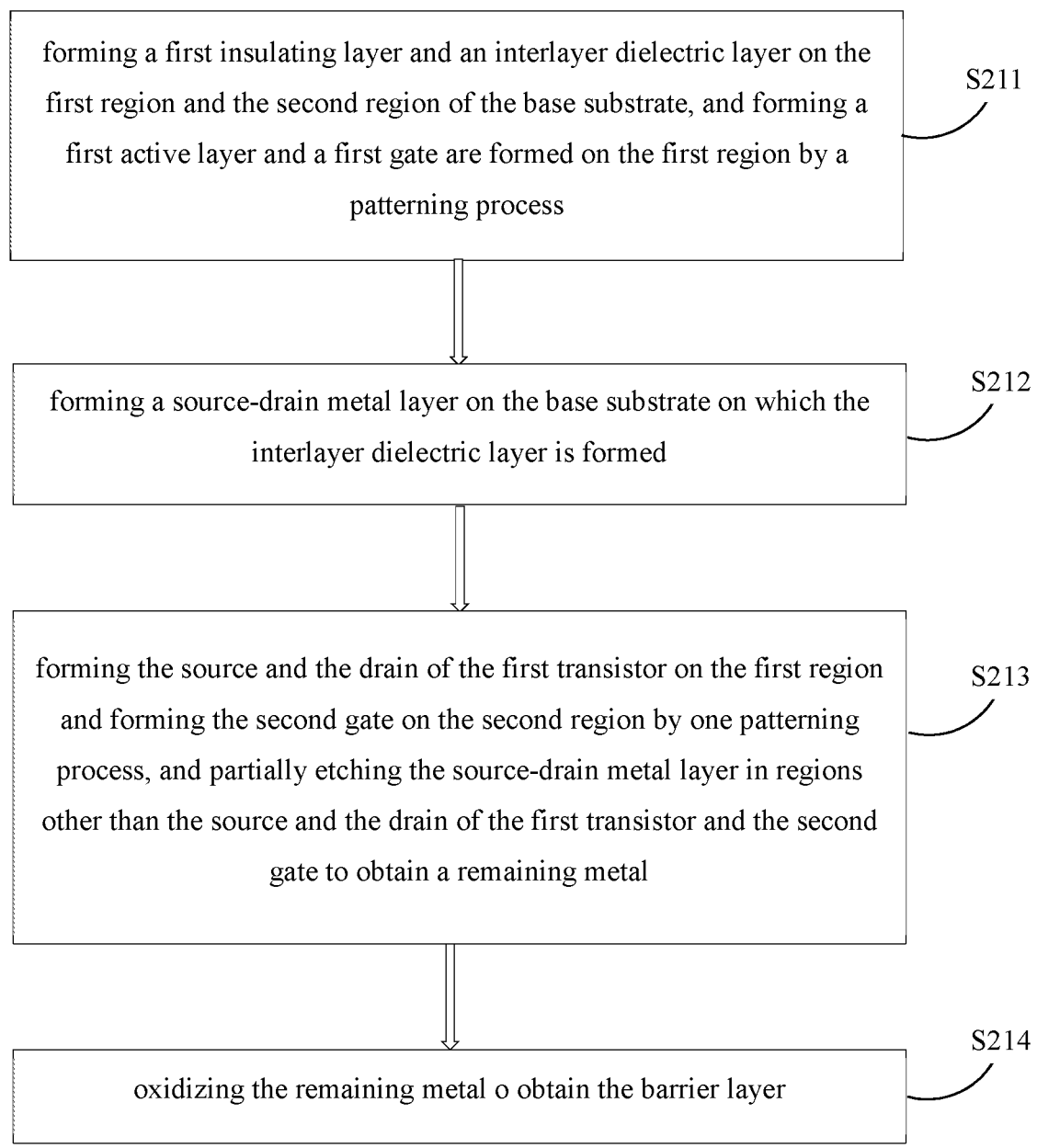
FIG. 3 illustrates a flowchart of step S21 in another exemplary embodiment of the present disclosure.

FIG. 3 shows a flowchart of step S21 in this embodiment.

As shown in FIG. 3, in step S211, a first insulating layer and an interlayer dielectric layer are formed on the first region and the second region of the base substrate, and a first active layer and a first gate are formed on the first region by a patterning process, wherein the interlayer dielectric layer covers the first gate and the first insulating layer.

As shown in FIG. 3, in step S212, a source-drain metal layer is formed on the base substrate on which the interlayer dielectric layer is formed.

As shown in FIG. 3, in step S213, the source and the drain of the first transistor are formed in the first region and the second gate is formed in the second region by one patterning process, the source-drain metal layer in regions other than the source and the drain of the first transistor and the second gate are partially etched to obtain a remaining metal.

As shown in FIG. 3, in step S214, the remaining metal is oxidized to obtain the barrier layer.

In this embodiment, the barrier layer is formed by performing oxidation treatment on the remaining metal that is left after partially etching the source-drain metal layer. Usually, the source-drain metal is an alloy material such as titanium-aluminum-titanium alloy or aluminum-titanium alloy. As such, in the process of etching the source-drain metal to form the source and the drain, the regions other than the source and the drain are partially etched to obtain the remaining metal (i.e., a first layer of metal) that is titanium or aluminum, which is further subjected to oxidative doping treatment, and the obtained titanium oxide or aluminum oxide is the barrier layer.

In this embodiment, a thickness of the barrier layer may be 100-300 Å. Take titanium oxide as an example, the titanium oxide of 100-300 Å has a property approximating to insulator, and can serve to block the hydrogen in the interlayer dielectric layer from entering a second transistor (thin film transistor) during subsequent heat treatments.

As shown in FIG. 2, in step S22, the second transistor is formed above the barrier layer in the second region by a plurality of patterning processes.

In this embodiment, the first active layer is of low-temperature polysilicon, the second active layer is of metal oxide semiconductor, and the second transistor is formed above the first transistor, and thus the barrier layer is formed between the interlayer dielectric layer and the second active layer.

The method for fabricating the array substrate provided in this embodiment will be described below with reference to FIG. 4 to FIG. 8.

Figure 4:
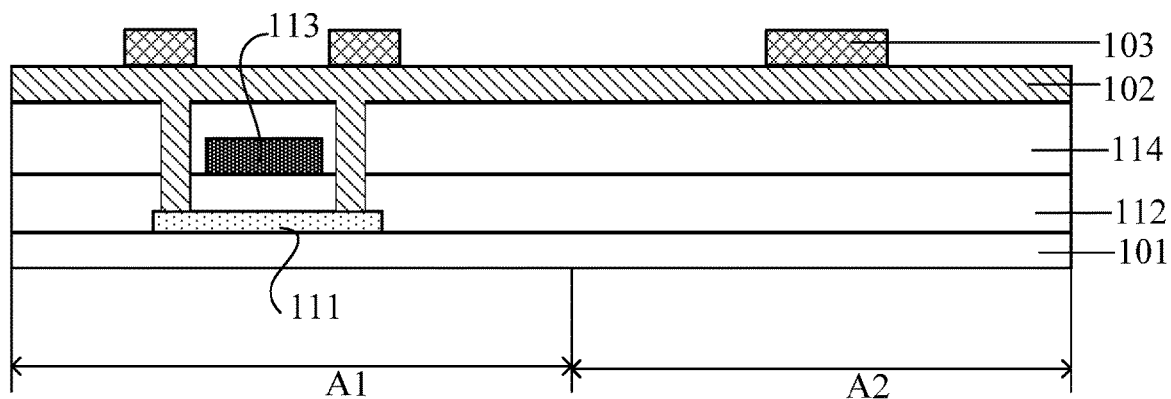
FIG. 4 illustrates a sectional view of a structure obtained by a process of fabricating a first transistor on a base substrate to obtain a source-drain metal layer in another exemplary embodiment of the present disclosure.

FIG. 4 illustrates a sectional view of structure obtained by a process of fabricating a first transistor on a base substrate to obtain a source-drain metal layer. Since the fabricating process for the first transistor is almost same as conventional LTPS-TFT fabricating process before the source and the drain are formed, no detailed description thereof is given here.

As shown in FIG. 4, the first active layer 111, the first insulating layer 112, the first gate 113, and the interlayer dielectric layer 114 covering the first gate 113 are sequentially formed on the base substrate 101 through a plurality of patterning processes, after which the source-drain metal layer 102 is deposited on the base substrate 101 on which the first active layer 111, the first insulating layer 112, the first gate 113, and the interlayer dielectric layer 114 are formed. Because the source-drain metal layer 102 is a multi-layered alloy metal (taking titanium-aluminum-titanium alloy as an example), it has to be formed through multiple metal sputtering processes.

Afterwards, a photoresist 103 is applied on the source-drain metal layer 102, a photoresist pattern is formed by illuminating with a mask plate (as shown in FIG. 4), and the underlying source-drain metal layer 103 is etched in compliance with the photoresist pattern shown in FIG. 4. After etching, the source 115 and the drain 116 of the first transistor and the second gate 121 covered by the photoresist pattern remain. It should also be noted that, in this embodiment, an EPD (End Point Detector) technique is used for partial etch during etching. That is, the metal of a certain thickness, i.e., the remaining metal, is left in regions uncovered by the photoresist pattern. The EPD uses the change in light intensity at a specific wavelength from the start of etching to the end of the etching, to detect the most appropriate end point of the etching, thereby ensuring that the bottommost metal can remain during the etching process.

Taking this embodiment as an example, titanium metal of 100-300 Å remains, and then the remaining metal is oxygen-doped by an ion implanter technology, to oxidize the exposed thin-layer of metal, i.e., titanium, with the oxidized metal remaining on the outside of the photoresist as titanium oxide, thereby forming the barrier layer 115. The titanium oxide of 100-300 Å has an approximate insulator property, and thus can function to block hydrogen in the interlayer dielectric layer from entering the active layer of the second transistor.

In other embodiments of the present disclosure, the remaining metal may also be aluminum, and correspondingly, it may be doped with oxygen to obtain aluminum oxide to form the barrier layer 115.

In addition, during the metal oxidation process using ion implantation technology, active oxygen ions are implanted into the metal to form a transparent insulating layer oxide. Specifically, depending on the ion species, the energy range can be controlled in the range of 6 to 10 Key, the electron beam current can be controlled in the range of (6 to 9) ±10% uA/cm, and the number of scanning is 3 to 5 times, to ensure that the remaining metal can be fully oxidized.

It should be noted that the above parameters may vary slightly depending on devices, but this is not the key point to be protected by the method of this embodiment.

Figure 5:
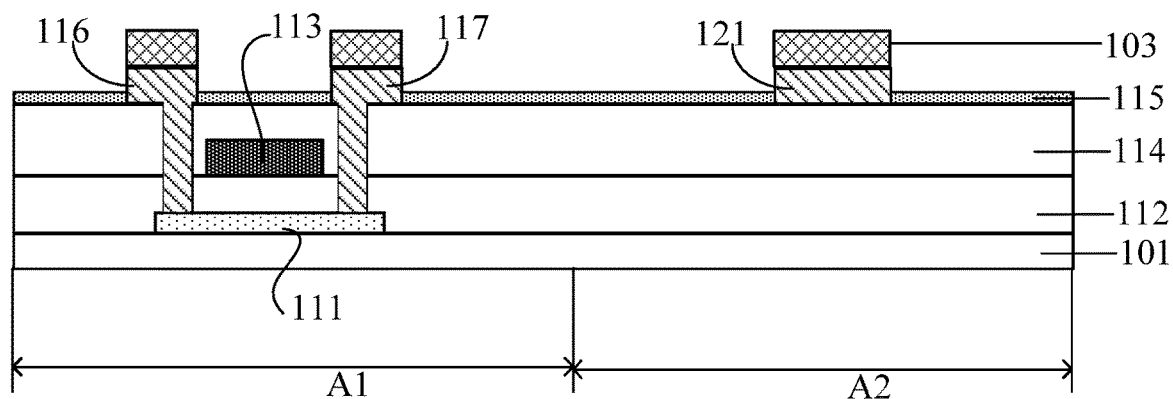
FIG. 5 illustrates a sectional view of a structure in which a barrier layer is formed based on the structure shown in FIG. 4 in another exemplary embodiment of the present disclosure.

FIG. 5 illustrates a sectional view of a structure in which a barrier layer is formed based on the structure shown in FIG. 4.

After the metal oxidation treatment has been completed, photoresist stripping is performed. Then the second insulating layer 122, the second active layer 123, and the protection layer 124 covering the second active layer 123 are formed to obtain an LTPO backplane. This process is the same as the conventional process, so it will not be described here in detail.

Figure 6:
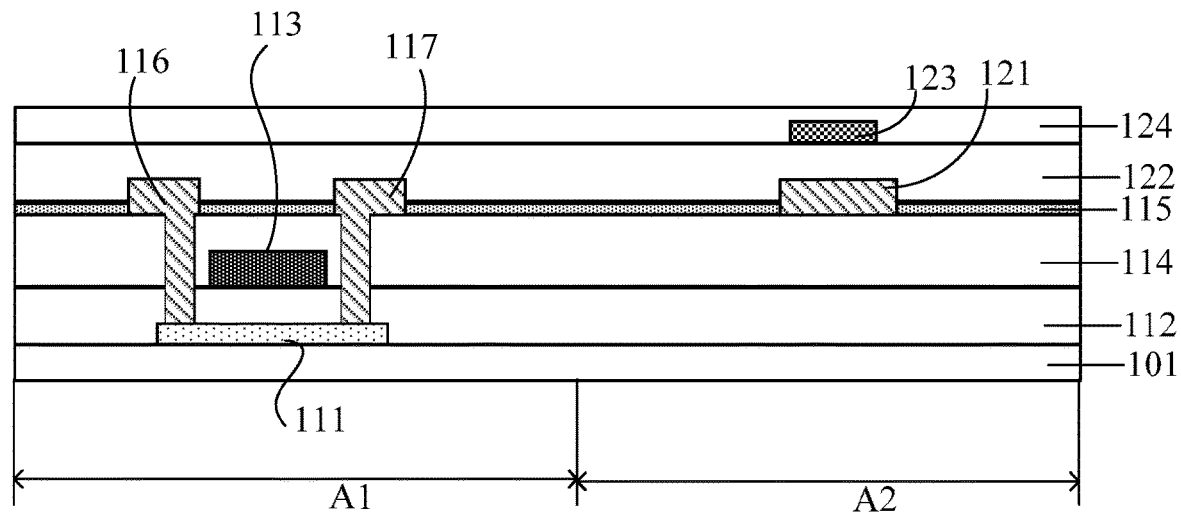
FIG. 6 illustrates a sectional view of structure in which a second insulating layer, a second active layer, and a protection layer is formed based on the structure shown in FIG. 5 in another exemplary embodiment of the present disclosure.

FIG. 6 illustrates a sectional view of structure in which a second insulating layer, a second active layer, and a protection layer is formed based on the structure shown in FIG. 5.

Afterwards, the second insulating layer 122 and the protection layer 124 are etched using a photolithography process, to form three through holes H1, H2 and H3 corresponding to the drain 117 of the first transistor and two ends of the second active layer 123.

Figure 7:
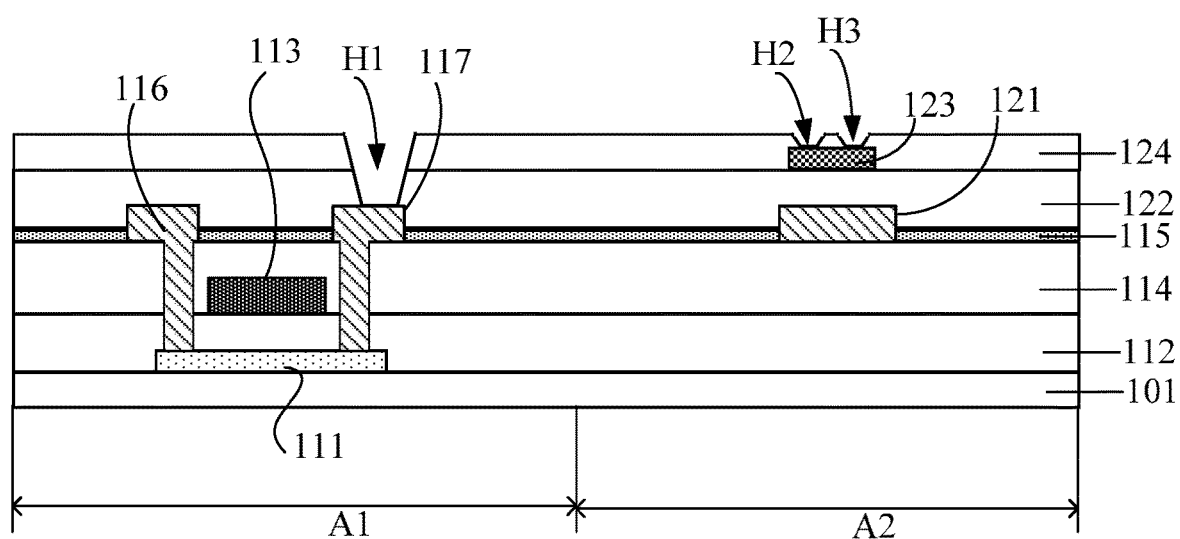
FIG. 7 illustrates a sectional view of a structure in which a through hole is formed based on the structure shown in FIG. 6 in another exemplary embodiment of the present disclosure.

FIG. 7 illustrates a sectional view of a structure in which a through hole is formed based on the structure shown in FIG. 6.

Afterwards, a second metal layer is deposited based on the structure shown in FIG. 7, and the source 125 and the drain 126 of the second transistor are formed through a patterning process.

Figure 8:
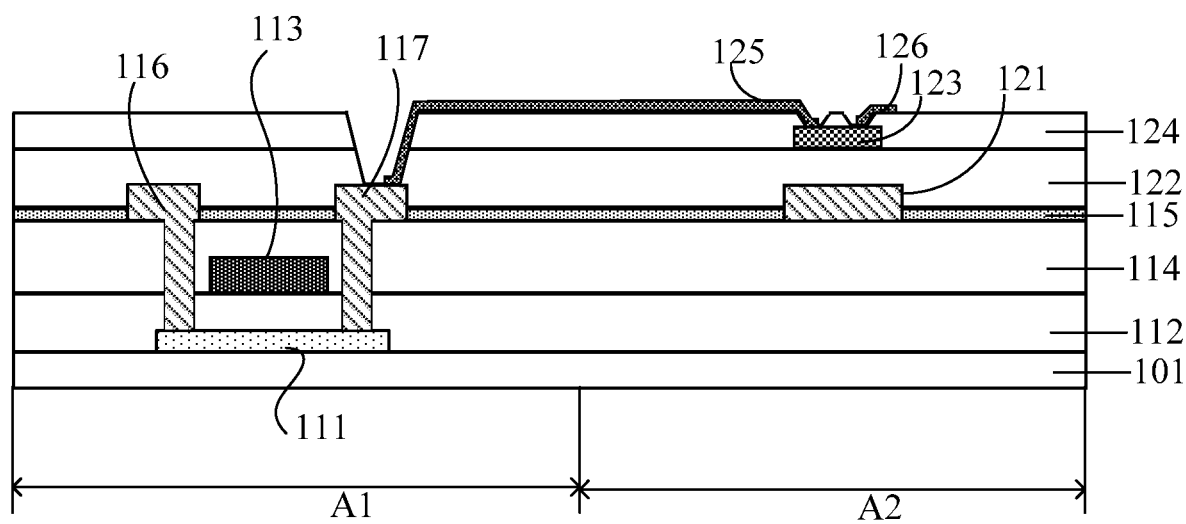
FIG. 8 illustrates a sectional view of a structure in which a source and a drain are formed based on the structure shown in FIG. 7 in another exemplary embodiment of the present disclosure.

FIG. 8 illustrates a sectional view of a structure in which a source and a drain are formed based on the structure shown in FIG. 7.

It should be noted that the positions of the source and the drain in the present embodiment are not limited to those shown in the present embodiment. That is, the positions of the source and the drain may also be interchanged, and are to be determined based on specific circuit designs.

Finally, a passivation layer 127 is formed based on the structure shown in FIG. 8 to obtain the structure of the array substrate shown in FIG. 1. That is, the structures of the first transistor and the second transistor are formed on the base substrate, and a barrier layer is disposed between the interlayer dielectric layer of the first transistor and the second active layer to provide insulation and blocking.

It should be noted that the one patterning process in this embodiment usually includes processes such as photoresist application, exposure, development, etching, and photoresist stripping.

In summary, with the method for fabricating an array substrate provided by the present embodiment, a barrier layer is formed by partially etching the source-drain metal layer on the base substrate and then performing oxidation treatment, plays insulation and hydrogen-blocking role for the interlayer dielectric layer of the low-temperature polysilicon thin film transistor and the active layer of the oxide thin film transistor, can block the hydrogen permeation between the low-temperature polysilicon thin film transistor and the oxide thin film transistor in the subsequent heat treatment process, and protects the transistor characteristics of the low-temperature polysilicon thin film transistor and the oxide thin film transistor from being adversely affected. In addition, the barrier layer may also block hydrogen and oxygen in the second active layer from affecting the transistor characteristics of the low-temperature polysilicon thin film transistor in the subsequent heat treatment.

Based on the foregoing, an embodiment of the present disclosure also provides a display device including any of the above array substrates. The display device may be any product or component having a display function such as a liquid crystal panel, an electronic paper, an OLED panel, a mobile phone, a tablet computer, a television set, a display, a notebook computer, a digital photo frame, and a navigator.

Correspondingly, the display device also has the same technical effects as the array substrate, and will not be described here.

Other embodiments of the present disclosure will readily occur to those skilled in the art upon consideration of the specification and practice of the invention disclosed herein. This application is intended to cover any variation, use, or adaptation of the present disclosure that follows the general principles of the present disclosure and includes common knowledge or conventional technological means in the art that is not disclosed in the present disclosure. It is intended that the specification and embodiments are considered as exemplary only. The true scope and spirit of the present disclosure is indicated by the appended claims.

What is claimed is:

1. An array substrate, comprising:
a base substrate,
wherein the base substrate comprises a first region and a second region provided with a first transistor and a second transistor, respectively, the first transistor comprises a first active layer of low-temperature polysilicon, and the second transistor comprises a second active layer of metal oxide semiconductor; and
wherein the first active layer, an interlayer dielectric layer and the second active layer are sequentially disposed on the base substrate, and a barrier layer is disposed between the interlayer dielectric layer and the second active layer,
wherein the barrier layer is formed by oxidation treatment of remaining metal that is left after partially etching a source-drain metal layer.

2. The array substrate according to claim 1, wherein the barrier layer has a thickness of about 100-300 Å.

3. The array substrate according to claim 1, wherein a material for the remaining metal is titanium, and a material for the barrier layer is titanium oxide; or
a material for the remaining metal is aluminum, and a material for the barrier layer is aluminum oxide.

4. The array substrate according to claim 1, wherein the first transistor is of a top-gate structure.

5. The array substrate according to claim 4, wherein the first transistor comprises the first active layer, a first insulating layer, a first gate and the interlayer dielectric layer formed on the base substrate in sequence, and a source and a drain of the first transistor are respectively electrically connected to two ends of the first active layer via two through holes.

6. The array substrate according to claim 5, wherein the second transistor is of a bottom-gate structure.

7. The array substrate according to claim 6, wherein the second transistor comprises a second gate, a second insulating layer, the second active layer and a protection layer formed on the barrier layer in sequence, and a source and a drain of the second transistor are respectively electrically connected to two ends of the second active layer via two through holes.

8. The array substrate according to claim 1, wherein the second transistor is of a bottom-gate structure.

9. The array substrate according to claim 8, wherein the second transistor comprises a second gate, a second insulating layer, the second active layer and a protection layer formed on the barrier layer in sequence, and a source and a drain of the second transistor are respectively electrically connected to two ends of the second active layer via two through holes.

10. A method for fabricating the array substrate according to claim 1, comprising:
forming a first transistor and a barrier layer on a first region of a base substrate by a plurality of patterning processes, the first transistor having a first active layer and an interlayer dielectric layer, and the first active layer being of low-temperature polysilicon; and
forming a second transistor above the barrier layer in a second region by a plurality of patterning processes, the second transistor having a second active layer of metal oxide semiconductor,
wherein the barrier layer is formed between the interlayer dielectric layer and the second active layer, and the barrier layer extends to the second region of the base substrate.

11. The method for fabricating the array substrate according to claim 10, wherein the step of forming a first transistor and a barrier layer comprises:
forming a first insulating layer and the interlayer dielectric layer on the first region and the second region of the base substrate, and forming the first active layer and a first gate on the first region by a patterning process, wherein the interlayer dielectric layer covers the first gate and the first insulating layer;
forming a source-drain metal layer on the base substrate on which the interlayer dielectric layer is formed;
forming a source and a drain of the first transistor in the first region and forming a second gate in the second region by one patterning process, and partially etching the source-drain metal layer in regions other than the source and the drain of the first transistor and the second gate to obtain a remaining metal; and
oxidizing the remaining metal to obtain the barrier layer.

12. The method for fabricating the array substrate according to claim 11, wherein a material for the source-drain metal layer is a titanium-aluminum-titanium alloy, the remaining metal is titanium, and a material for the barrier layer is titanium oxide; or
a material for the source-drain metal layer is an aluminum-titanium alloy, the remaining metal is aluminum, and a material for the barrier layer is aluminum oxide.

13. The method for fabricating the array substrate according to claim 10, wherein the first insulating layer or the second insulating layer is a gate insulating layer.

14. The method for fabricating the array substrate according to claim 13, wherein the first insulating layer or the second insulating layer is a single-layered silicon oxide film or a double-layered film comprising silicon nitride and silicon oxide.

15. The method for fabricating the array substrate according to claim 10, wherein a material for the interlayer dielectric layer is SiNx/SiO2.

16. The method for fabricating the array substrate according to claim 15, wherein the interlayer dielectric layer is formed by activation and hydrogenation treatments after film formation.

17. The method for fabricating the array substrate according to claim 15, wherein the interlayer dielectric layer is formed by activation treatment at about 600° C. for a range of about 1 to 3 minutes and hydrogenation treatment at a range of about 380 to 420° C. for about 30 minutes after film formation.

18. A display device comprising the array substrate according to claim 1.

* * * * *